US008887111B2

(12) United States Patent  (10) Patent No.: US 8,887,111 B2
Meredith et al.  (45) Date of Patent: Nov. 11, 2014

(54) EXTRACTION AND SHARING IN HIGH LEVEL SYNTHESIS

(71) Applicant: C2 Design Automation, Redmond, WA (US)

(72) Inventors: Michael Scott Meredith, Seattle, WA (US); Stephen B. Sutherland, Redmond, WA (US)

(73) Assignee: C2 Design Automation, Redmond, WA (US)

( * ) Notice: Subject to any disclaimer, the term of this patent is extended or adjusted under 35 U.S.C. 154(b) by 0 days.

(21) Appl. No.: 13/968,688

(22) Filed: Aug. 16, 2013

(65) Prior Publication Data

US 2014/0053119 A1 Feb. 20, 2014

Related U.S. Application Data

(60) Provisional application No. 61/683,943, filed on Aug. 16, 2012.

(51) Int. Cl.
G06F 17/50 (2006.01)
(52) U.S. Cl.
CPC .................................. G06F 17/5045 (2013.01)
USPC ........................... 716/104; 716/100; 716/103
(58) Field of Classification Search
CPC .... G06F 17/5045; G06F 17/505; G06F 17/50
USPC .......................................... 716/100, 103–104
See application file for complete search history.

(56) References Cited

U.S. PATENT DOCUMENTS

| 6,836,877 | B1 * | 12/2004 | Dupenloup | 716/103 |
|---|---|---|---|---|
| 7,013,438 | B1 * | 3/2006 | Saldanha et al. | 716/104 |
| 7,305,650 | B1 | 12/2007 | Jensen | |
| 8,516,412 | B2 * | 8/2013 | Cho et al. | 716/103 |
| 2005/0028135 | A1 * | 2/2005 | Burnette et al. | 717/106 |
| 2010/0218146 | A1 * | 8/2010 | Platzker et al. | 716/4 |
| 2012/0089956 | A1 * | 4/2012 | Bakshi et al. | 716/105 |
| 2013/0239075 | A1 * | 9/2013 | Gaugler et al. | 716/105 |

OTHER PUBLICATIONS

Gupta, S. et al., "Hardware Interface Synthesis of FPGA Blocks using Parallelizing Code Transformations", 2003., Center for Embedded Computer Systems, University of California, Irvine and San Diego. pp. 1-23.*

* cited by examiner

*Primary Examiner* — Stacy Whitmore
(74) *Attorney, Agent, or Firm* — Kenyon & Kenyon LLP

(57) ABSTRACT

Technology for translating a behavioral description of a circuit into a structural description of the circuit is disclosed. The behavioral description may describe the circuit in terms of the behavior, or other functionality, of multiple circuit portions, with at least some of the multiple circuit portions having multiple components. The technology includes determining components across the multiple circuit portions of the behavioral description that have commonalities, and synthesizing the structural description with a description of a shared circuit portion instead of individual structural descriptions of the components having the determined commonality. The synthesized structural description may be organized according to a different hierarchical structure than that of the behavioral description.

20 Claims, 12 Drawing Sheets

```
SC_MODULE(top)
{
public:
  sc_in_clk clk;
  sc_in<bool> reset;

SC_CTOR(top) :
    m_design1("design1"),
    m_mems("mems"),
    m_design2("design2")
  {
    m_design1.din( design1_din );
    m_design1.dout( design1_dout );
    m_design2.din( design2_din );
    m_design2.dout( design2_dout );
    m_design1.clk(clk);
    m_design1.reset(reset);
    m_design2.clk(clk);
    m_design2.reset(reset);
    m_mems.clk(clk);
    m_mems.rst(reset);

m_mems( m_design1, m_design2 );
  } sc_in< sc_uint<8> > design1_din;
  sc_in< sc_uint<8> > design2_din;
  sc_out< sc_uint<8> > design1_dout;
  sc_out< sc_uint<8> > design2_dout;

design1_wrapper m_design1;
  design2_wrapper m_design2;
  mems_wrapper m_mems;
};
```

Example Behavioral Description

*FIG. 6A*

```
module flop (data, clock, clear, q, qb);
input data, clock, clear;
output q, qb;
// primitive #delay instance-name (output, input1, input2, .....),
nand #10 nd1 (a, data, clock, clear),
    nd2 (b, ndata, clock),
    nd4 (d, c, b, clear),
    nd5 (e, c, nclock),
    nd6 (f, d, nclock),
    nd8 (qb, q, f, clear);
nand #9 nd3 (c, a, d),
    nd7 (q, e, qb);
not #10 inv1 (ndata, data),
    inv2 (nclock, clock);
endmodule
```

Example Structural Description

*FIG. 6C*

Example Gate Level Description

US 8,887,111 B2

EXTRACTION AND SHARING IN HIGH LEVEL SYNTHESIS

CROSS REFERENCE TO RELATED APPLICATION

This application claims priority to U.S. Provisional Pat. App. No. 61/683,943 filed on Aug. 16, 2012, entitled "High-Level Synthesis (HLS) Using Extraction and Sharing of in a Structural Hierarchy". The entirety of this afore-mentioned application is incorporated herein by reference.

BACKGROUND

In recent years, there have been significant improvements and other advances in Integrated Circuit (IC) technology, such as the technology for Application Specific Integrated Circuits (ASICs), Reduced Instruction Set Computing (RISC) microprocessors, Field Programmable Gate Arrays (FPGAs), Programmable Logic Devices (PLDs), and/or the like. For example, these developments have resulted in faster, smaller, and cheaper ICs.

In conjunction with these advances in IC technology, the Electronic Design Automation (EDA) industry has developed tools that both fuel and benefit from these advances. For example, logic synthesis tools have been developed that enable a circuit to be specified at a one level of abstraction then translated to another level of abstraction, e.g., a lower level of abstraction.

Certain logic synthesis tools may be employed to perform these and other translations. For example, such tools may be employed to translate a Register Transfer Level (RTL) language description (e.g., a Verilog, Very-High-Speed Integrated Circuits Hardware Description Language (VHDL), or Advanced Boolean Expression Language (ABEL) description) into a gate level description that can more easily be implemented in an IC. As another example, behavioral synthesis tools may be employed to synthesize a behavioral description of a circuit (e.g., a SystemC or SpecC description) into a RTL or gate level description.

BRIEF DESCRIPTION OF THE DRAWINGS

Non-limiting and non-exhaustive examples of the disclosed technology are described with reference to the following drawings. In the drawings, like reference numerals refer to like parts throughout the various figures unless otherwise specified. These drawings are not necessarily drawn to scale.

For a better understanding of the disclosed technology, reference will be made to the following Detailed Description, which is to be read in association with the accompanying drawings, wherein:

FIGS. 6A, 6B, 6C and 6D are respective examples of a SystemC behavioral description, a Control Data Flow Graph (CDFG) description, a Verilog structural description, and a gate level description according to aspects of the technology.

DETAILED DESCRIPTION

Figure 1:
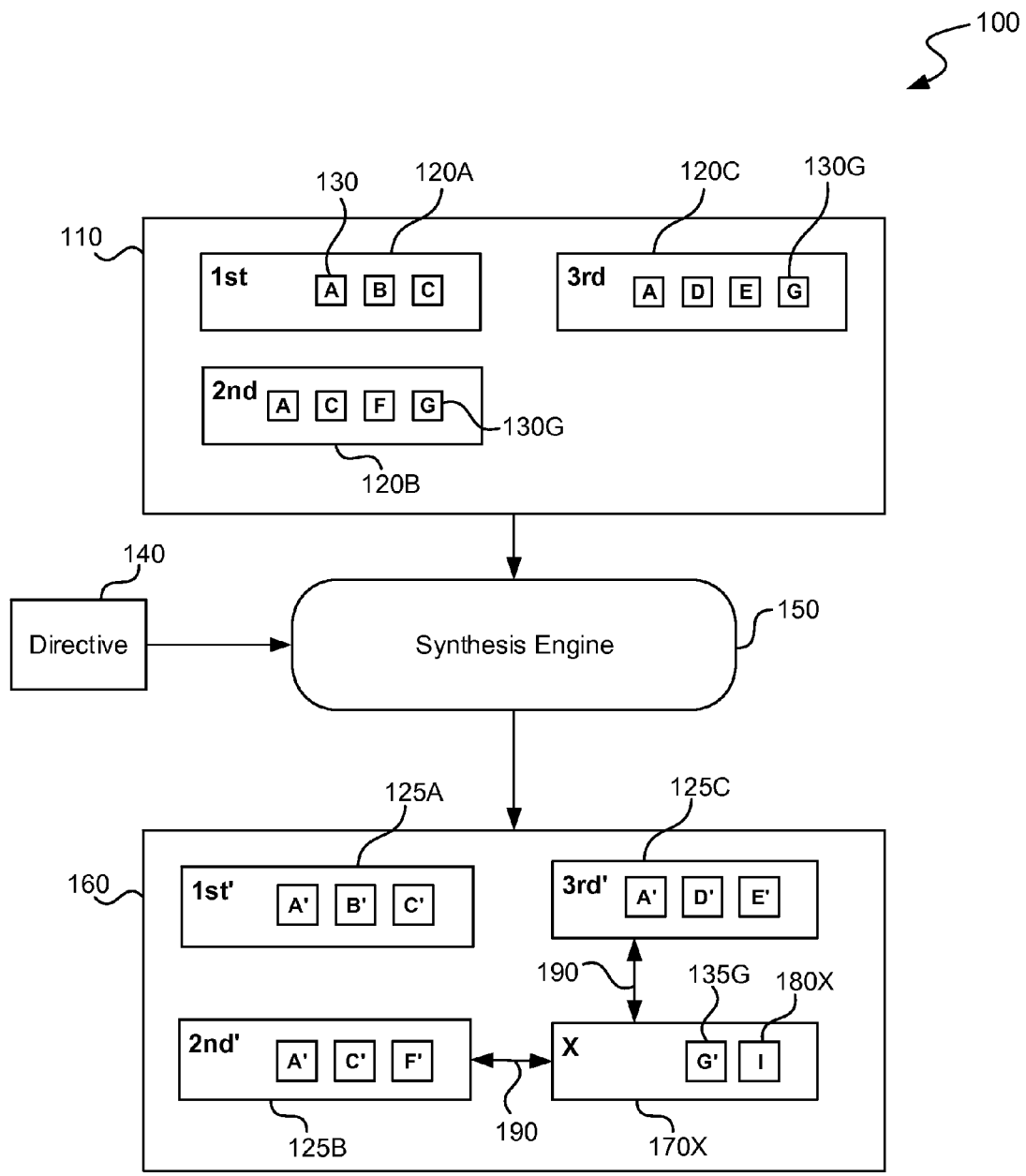
FIG. 1 is a diagram illustrating an overview of a circuit synthesis flow according to aspects of the technology.

The following description provides specific details for a thorough understanding of, and enabling description for, various embodiments of the technology. One skilled in the art will understand that the technology may be practiced without many of these details. In some instances, well-known structures and functions have not been shown or described in detail to avoid unnecessarily obscuring the description of embodiments of the technology. It is intended that the terminology used in this disclosure be interpreted in its broadest reasonable manner, even though it is being used in conjunction with a detailed description of certain embodiments of the technology. Although certain terms may be emphasized below, any terminology intended to be interpreted in any restricted manner will be overtly and specifically defined as such in this Detailed Description section. For example, the term "based on" or "based upon" is not exclusive and is equivalent to the term "based, at least in part, on" and includes being based on additional factors, some of which are not described herein. References in the singular are made merely for clarity of reading and include plural references unless plural references are specifically excluded. The term "or" is an inclusive "or" operator and is equivalent to the term "and/or" unless specifically indicated otherwise. As used herein, the terms "component" and "system" are intended to encompass hardware, software, or various combinations of hardware and software. Thus, for example, a system or component may be a process, a process executing on a computing device, the computing device, or a portion thereof.

As used herein, the terms "extract," "extracted," "extracting," "extraction," and similar may refer to removal of information from a description/representation, or the generation of another description/representation (e.g., a downstream description/representation) that does not include the "extracted" information. In other words, use of these terms does not necessarily indicate a change to the "original"/"source" description/representation from which the information is "extracted." In addition, these terms may also refer to generation of a description/representation containing the "extracted" information, for example, the generation of a description or representation with only the "extracted" information, or one with the "extracted" information and additional information associated with the "extracted" information. In other words, these terms may refer to generation of descriptions/representations from an "original"/"source" description/representation, wherein the information from the "original"/"source" description/representation is partitioned or otherwise separated into an "extracted" portion and another "un-extracted" portion of the generated description/representation.

Introduction

Technology for translating a behavioral description of a circuit into a structural description of the circuit is disclosed. The behavioral description may describe the circuit in terms of the behavior, or other functionality, of multiple circuit portions, with at least some of the multiple circuit portions having multiple components. The technology includes determining components across the multiple circuit portions of the behavioral description that have commonalities, and synthesizing the structural description with a description of a shared circuit portion instead of individual structural descriptions of the components having the determined commonalities. The synthesized structural description may be organized according to a different hierarchical structure than that of the behavioral description.

In one non-limiting example, the disclosed technology may be implemented in a High-Level Synthesis (HLS) flow that includes receiving a behavioral description of a circuit that includes information associated with a first circuit portion and a second circuit portion. In this example, the first and second circuit portions are each associated with a particular behavior or other functionality. The HLS flow may include translating the behavioral description into one or more intermediate descriptions of the circuit that respectively include intermediate descriptions of the first and second circuit portions. The HLS flow may also include synthesizing a structural description from one or more of the intermediate descriptions. For example, the synthesized structural description may include a description of a shared circuit portion that includes the particular functionality and structural descriptions of the first and second circuit portions. The structural descriptions of the first and second circuit portions may include representations of interfaces to the shared circuit portion rather than individual representations of the particular functionality.

As another example, the technology may be employed to perform a high level synthesis (HLS) of a circuit to synthesize a relatively abstract description of the circuit into a less abstract description of the circuit for physical implementation in target hardware (e.g., an Application Specific Integrated Circuit (ASIC), Field Programmable Gate Array (FPGA), Programmable Logic Devices (PLD), other Integrated Circuit (IC), discrete gates, etc.). In these and other examples, the technology may be employed to synthesize a behavioral description of the circuit into a structural description of the circuit. However, any of the aspects of the technology described herein may also be employed to synthesize circuit descriptions from and to any suitable level(s) of abstraction. For example, the technology may be employed to synthesize a circuit description from one level of abstraction to the same level of abstraction or to synthesize a circuit description from a lower level of abstraction to a higher level of abstraction.

Regardless of the level of abstraction, a circuit description is generally divided into modules that typically correspond to portions of the circuit. For example, this partitioning of the circuit description and the circuit may serve to partition the description and circuit into pieces that are easier for an engineer or other circuit designer to design, comprehend, and/or validate. A circuit description may also include a hierarchical structure, e.g., that organizes modules on different hierarchical structures. Various aspects of the technology enable modules to be automatically moved between places in a hierarchical structure, for example, while satisfying interface and timing constraints. As with partitioning of a description/circuit, use of this hierarchical management technology may also simplify design and validation efforts for a circuit.

The disclosed technology may be employed to extract representations of common functionality (including representations of components that provide common behavior or other functionality) from multiple representations of circuit portions, to generate a representation of a shared module or other shared circuit portion, interfaces to the shared circuit portion, and to employ representations of the shared circuit portion and interfaces instead of individual structural or other descriptions of the circuitry that is to provide the common functionality in downstream synthesis. In addition, the shared circuit portion, interfaces, and/or other portions of the design and/or circuit may be generated or otherwise synthesized with features to control accesses from the multiple circuit portions, for example, to arbitrate or otherwise control access to the shared circuit portions.

The multiple circuit portions, the shared circuit portion, and/or representations thereof, may be synthesized at any place in the hierarchical structure, including different hierarchical structure locations than at which they were represented in an upstream description. For example, the multiple circuit portions and the shared circuit portion of a synthesized design may all be all in the same/a common hierarchical level, for example, in a single level hierarchical structure.

Use of these and other aspects of the technology may lead to better synthesized circuits due to, for example, cleaner data and/or control paths, improved timing and/or other performance, and/or implementation of the synthesized circuit using less chip area and/or other physical resources. For example, the technology may enable circuitry that provides common functionality to be shared between multiple circuit portions where separate redundant circuitry would have otherwise been employed.

Illustrative Circuit Synthesis Flows/Devices

FIG. 1 is an overview 100 of a circuit synthesis flow according to aspects of the technology. As shown, overview 100 includes behavioral description 110, directive 140, synthesis engine 150, and structural description 160. In this example, behavioral description 110 and structural description 160 may both be descriptions of the same circuit but describe the circuit at different levels of abstraction. As shown, behavioral description 110 and directive 140 are inputs to synthesis engine 150, which in turn outputs structural description 160.

In the example of FIG. 1, behavioral description 110 includes behavioral descriptions 120A-120C representing three circuit portions. In addition, behavioral description 120A includes representations 130 of components that are associated with functionality of the type A, B, and C; behavioral description 120B includes representations 130 of components that provide functionality of the type A, C, F, and G; and behavioral description 120C includes representations 130 of components that provide functionality of the type A, D, E, and G.

In this example, behavioral descriptions 120A-120C are logical collections or other associations of representations 130, and represent portions of the circuit. Further, representations 130 represent components (e.g., subsets of circuit portions) that are associated with specific functionalities (e.g., as indicated by the letters A-G). Each of representations 130 may include a functional statement or a set of sequential functional statements that are analogous in the circuit domain to at least a portion of the components represented by each particular representation 130. One or more of representations 130 may also be or refer to a pre-synthesized component (e.g., from a library), a component of the hardware to which the circuit is targeted (e.g., a memory, a general purpose processor core, a signal processing core, etc.), and/or the like. Collectively, the multiple representations may represent functionalities that may be provided concurrently/in parallel.

By way of example, the components represented by representations 130 may include data path components, control path components, clocking elements, signal distribution elements, and/or the like. They may also include finite state machines (FSMs), encoders, decoders, hardware accelerators, memories, circuits adapted to perform mathematical functions (e.g., multipliers, adders, arithmetic logic units, etc.), circuits adapted to perform logical functions (e.g., AND gates, OR gates, NOT gates, multiplexers, etc.), filters, storage elements (e.g., memory bits, memory arrays, registers, flip-flops, etc.), and/or the like. Further, representations 130 may be expressed as functions, function calls, pointers, data structures, explicit instantiations (e.g., of components from one or more libraries, hardware components, etc.), code segments, combinations thereof, references thereto, and/or the like.

As illustrated, behavioral description 110 is organized in a hierarchical structure, which may or may not be reflected in the circuit it represents. Within behavioral description 110, behavioral descriptions 120A-120C are at a higher hierarchical level than representations 130. Further, behavioral description 110 is at a higher hierarchical level (e.g., a top and/or main hierarchical level) while the multiple constituent behavioral descriptions and representations that make up behavioral description 110 are at one or more lower hierarchical levels. In FIG. 1, behavioral descriptions 120A-120C are all located on the same hierarchical level with respect to each other and each of the representations is on the same hierarchical level with respect to the other representations. However, other behavioral descriptions may include behavioral descriptions and representations organized in any type of hierarchical structure and at other hierarchical levels.

Further, while specific numbers and types of behavioral descriptions, structural descriptions, representations, and/or the like are illustrated in overview 100, such numbers and types are illustrated merely for clarity. Other examples may include any number of these and other elements.

In one non-limiting example, directive 140 may serve as or include a construct defining the hierarchical structure of behavioral description 110 and/or its constituent elements, or serve as or include an indication of which behavioral descriptions 120A-120C and/or representations 130 are to be extracted by way of the circuit synthesis technologies of this disclosure. As a more specific example, directive 140 may serve as or include an indication that representations 130G of behavioral description 120B and behavioral description 120C are to be extracted. Directive 140 may also serve as or include an indication that representations 130G of behavioral description 120B and behavioral description 120C are functionally equivalent to each other. Further, directive 140 may also serve as or include an indication and/or guarantee that accesses to functionality associated with the to be extracted representations are to be mutually exclusive (e.g., that the circuit portions represented by behavioral description 120B and behavioral description 120C will not attempt to access the component that provides functionality G at the same time). Directive 140 may be a user input, metadata, a pragma, a pre-processor directive, an annotation in behavioral description 110, and/or the like. Additionally, directive 140 may be based on an automated analysis of a description of the circuit, e.g., via pattern recognition, analysis of the behavioral description, analysis of the intermediate description, artificial intelligence, and/or the like, and combinations thereof.

Synthesis engine 150 may be adapted to receive behavioral description 110 and directive 140 as input, and synthesize behavioral description 110 into structural description 160. However, synthesis engine 150 may alternately be adapted to synthesize a description at any suitable level of abstraction from a description at the same level of abstraction or at any other suitable level of abstraction. Synthesis engine 150 may be further adapted to receive and/or interface with one or more libraries associated with resources such as pre-synthesized components, hardware components, and/or the like.

Figure 2:
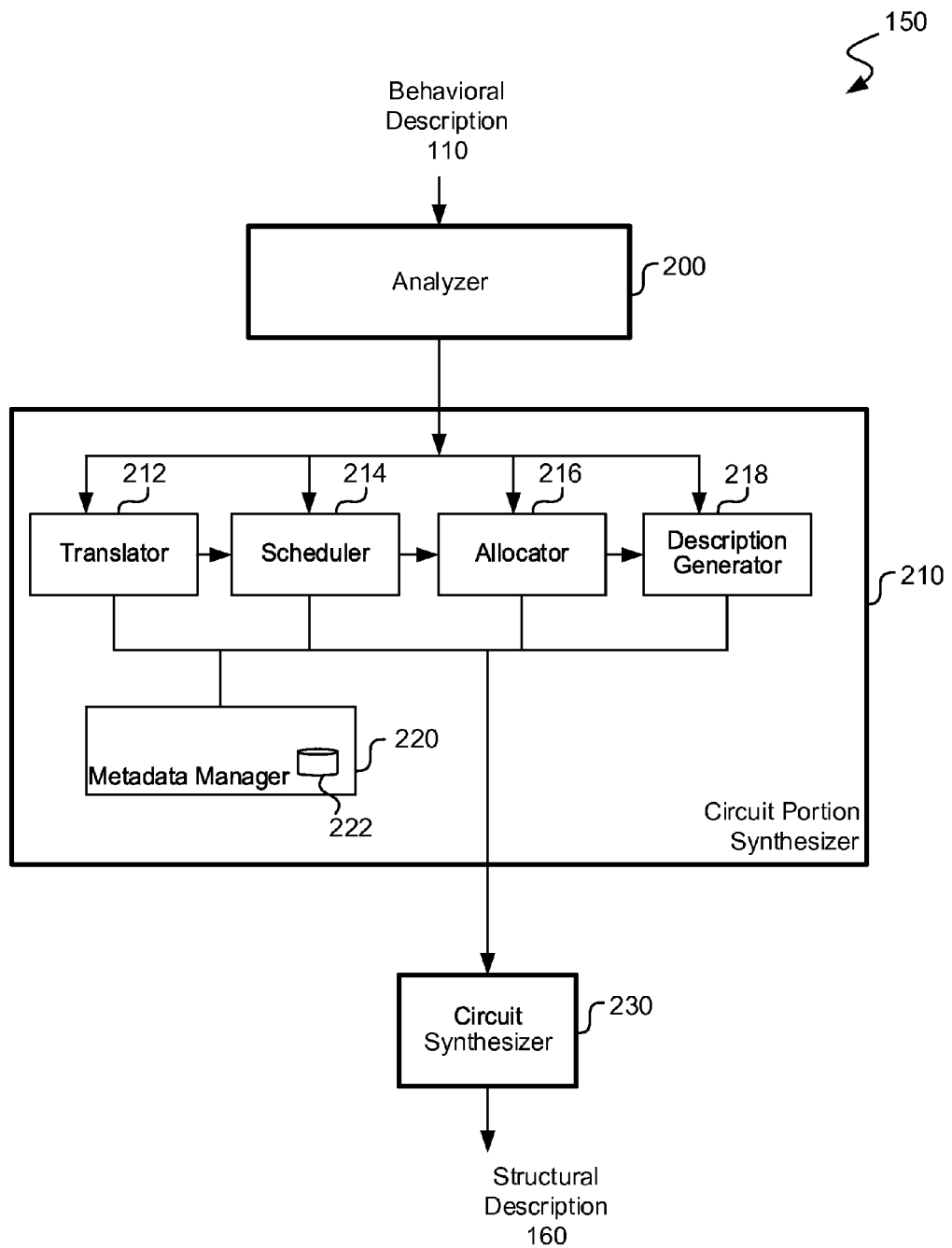
FIG. 2 is a block diagram illustrating functional blocks of synthesis engine 150 of FIG. 1 according to aspects of the technology.

Additional details regarding synthesis engine 150 are described in conjunction with FIG. 2.

In overview 100, structural description 160 may describe the same circuit described by behavioral description 110 in relatively less abstract language, such as in a Register Transfer Level (RTL) language, a gate level language, a netlist, and/or the like. For example, structural description 160 may describe the circuit in terms of components and the connections thereto. Depending on the hardware to which the circuit is targeted and/or the characteristics of structural description 160, structural description 160 may be directly implemented into the target hardware (e.g., fabricated, downloaded, etc.) or be further processed prior to implementation (e.g., place and route, simulation, verification, etc.). While the output of synthesis engine 150 is described in this example as being a structural description, non-structural descriptions may be output from other synthesis engines.

As shown, structural description 160 includes structural descriptions 125A-C, structural description 170X, and access paths 190. In this example, structural description 125A is a structural description of the circuit portion represented by behavioral description 120A, structural descriptions 125B and 125C are structural descriptions of the circuit portions respectively represented by behavioral descriptions 120B and 120C but without functionality G. Rather, the circuit portions represented by structural descriptions 125B and 125C are adapted to obtain functionality G from the components represented by representation 135G of structural description 170X by way of access paths 190. The circuit portions represented by structural descriptions 125B and 125C are examples of accessing circuit portions, e.g., circuit portions that access resources and/or functionality of shared circuit portions.

More specifically, interfaces may have been generated in structural descriptions 125B and 125C to link these structural descriptions to representation 135G. In this example, representation 135G is a structural description of functionality G' which corresponds to the representations 130G of functionality G. These generated interfaces may include, for example, input and output ports adapted to communicate with representation 135G across the boundaries of structural descriptions 125B-125 and 170X.

As illustrated in FIG. 1, structural description 170X is included in structural description 160, even though behavioral description 110 does not include a direct counterpart to structural description 170X. Rather, structural description 170X was generated by synthesis engine 150 based on aspects of the extraction and sharing technology described herein.

As shown in this example, structural description 170X includes representation 135G and representation 180X. As noted above, representation 135G is a structural description of functionality G' which corresponds to the representations 130G of functionality G. Also, representation 180X may include a structural description of an interface circuit adapted to arbitrate or otherwise control access from the components represented by structural descriptions 125B and 125C to the component represented by representation 135G. For example, the interface circuit represented by representation 180X may include an arbiter, a multiplexer, a decoder, access control circuitry, discrete gates, and/or the like. The circuit portions represented by structural description 170X may be an example of a shared circuit portion, e.g., a circuit portion associated with one or more resources and/or functionalities that are accessed by accessing circuit portions. The circuit portions represented by representations 135G and/or 180X may also be examples of shared circuit portions.

Additionally, access paths 190 may also have been generated by synthesis engine 150 based on aspects of the extraction and sharing technology described herein. These access paths may facilitate communication between the circuit portions represented by structural description 170X and structural descriptions 125B and 125C. Access paths 190 may be described in structural description 160 as pins, ports, wires, buses, and/or the like, or combinations thereof. Although the structural descriptions and representations in structural description 160 are on the same hierarchical levels as the corresponding behavioral descriptions and representations of behavioral description 110, other examples may differ.

Figure 3A:
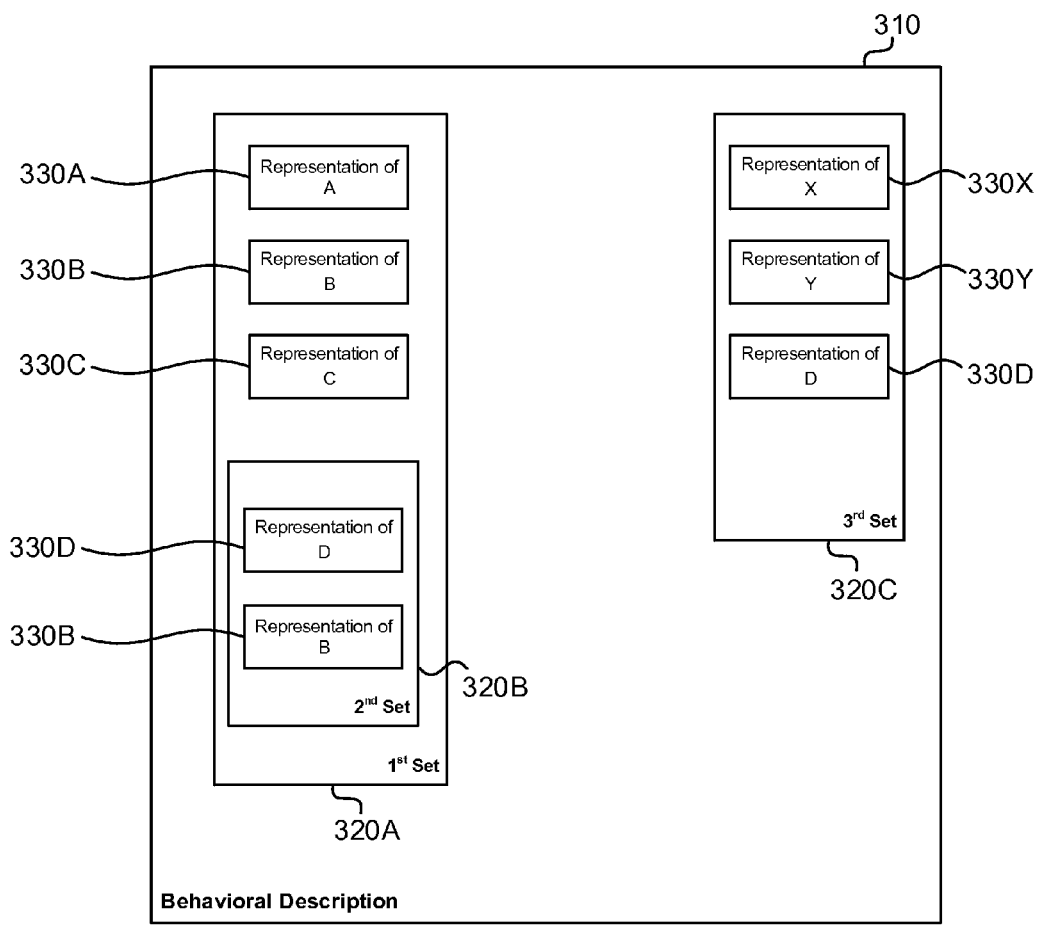
FIGS. 3A, 3B, and 3C are diagrams illustrating descriptions of a circuit at different levels of abstraction according to aspects of the technology.
Figure 3B:
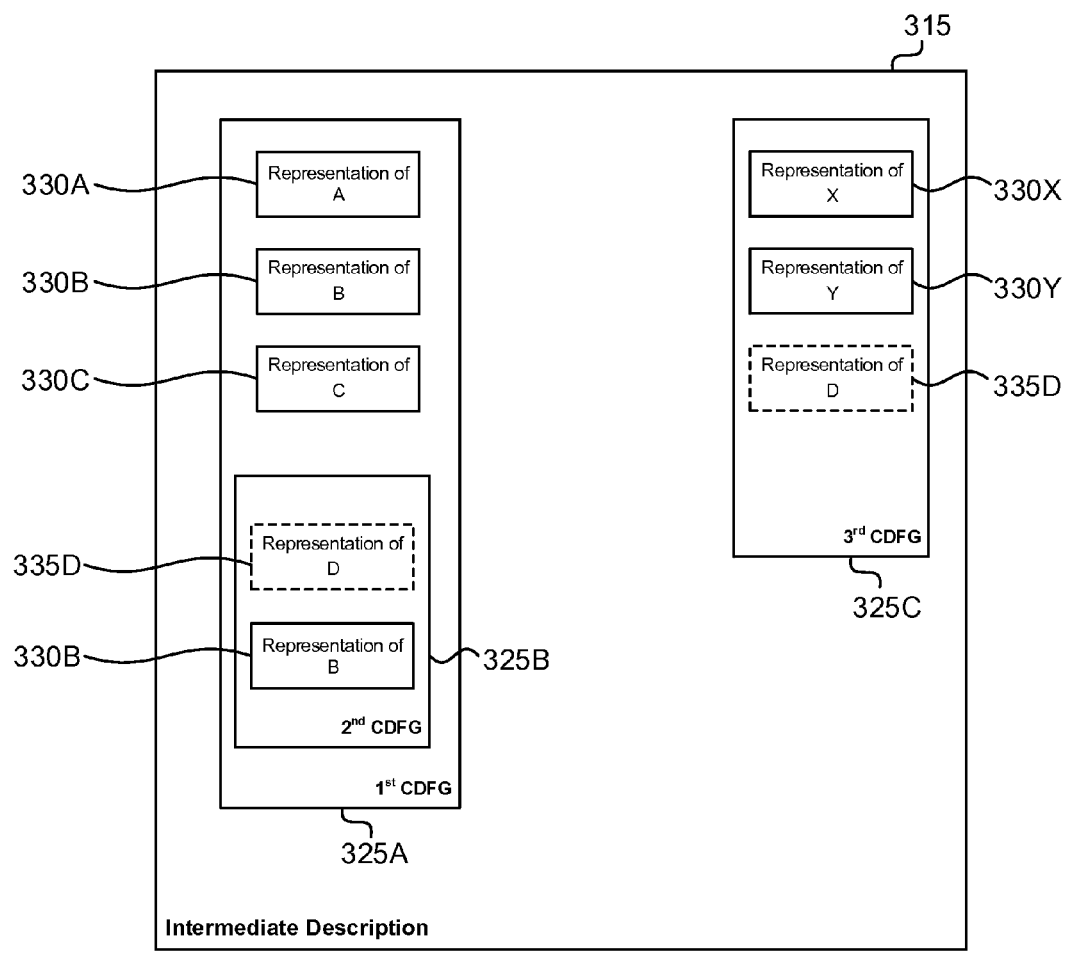
Figure 3C:
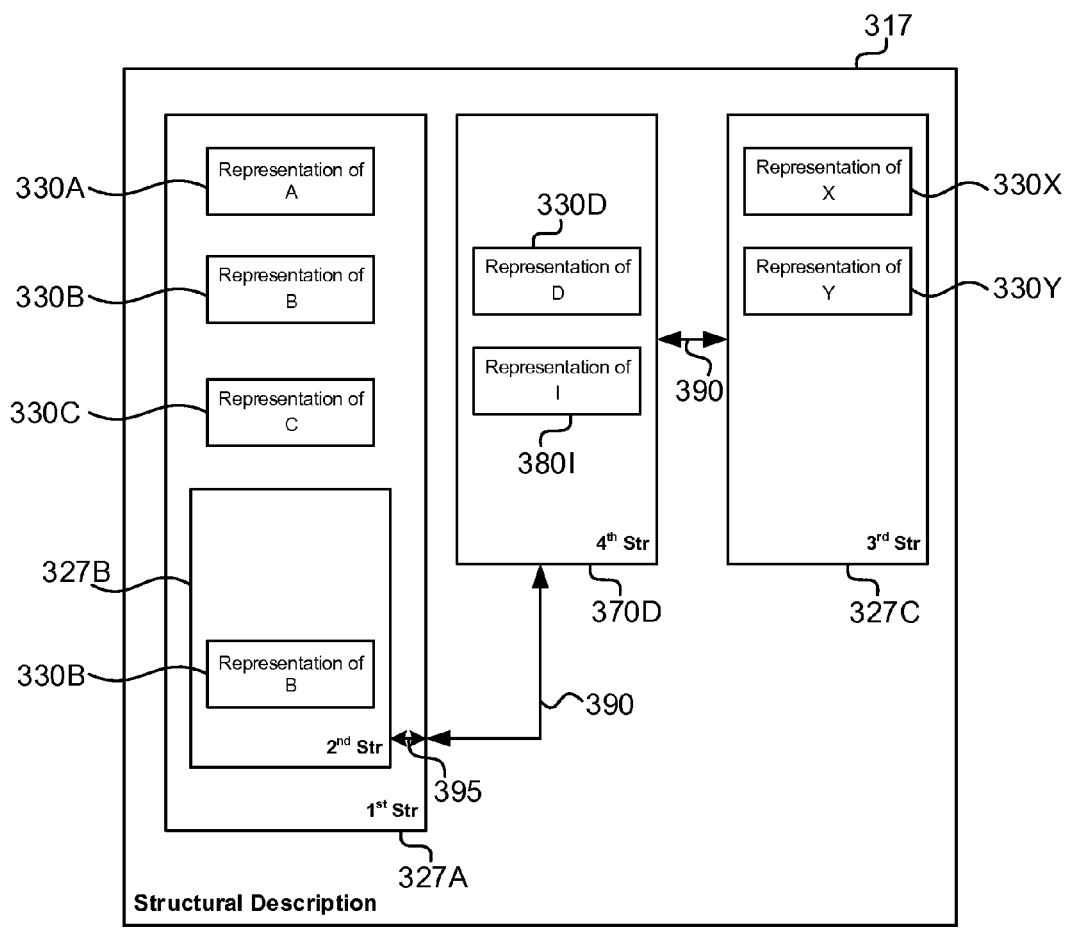

FIG. 2 illustrates components of synthesis engine 150 of FIG. 1. FIGS. 3A, 3B, and 3C are discussed in conjunction with FIG. 2 and include diagrams illustrating descriptions of a circuit at different levels of abstraction. In FIG. 2, synthesis engine 150 includes analyzer 200, circuit portion synthesizer 210, and circuit synthesizer 230.

As shown in FIG. 2, synthesis engine 150 is adapted to receive a behavioral description of a circuit that includes multiple circuit portions, for example, behavioral description 110 of FIG. 1. Although not shown in FIG. 2, synthesis engine 150 may also be adapted to receive a directive such as directive 140 of FIG. 1. In addition to being adapted to receive behavioral description 110, synthesis engine 150 may also be adapted to receive other behavioral descriptions, such as behavioral description 310 of FIG. 3A.

In contrast to behavioral description 110, behavioral description 310 is organized according to a more complex hierarchical structure. Within this hierarchical structure, behavioral description 310 includes behavioral descriptions 320A-320C with behavioral description 320B being at a lower hierarchical level than behavioral description 320A. Each of behavioral descriptions 320A-320C may represent a respective circuit portion. In FIG. 3A, functionalities A-D, X, and Y (or the components associated therewith) are respectively represented by representations 330A-330D, 330X, and 330Y. In one example, functionality D may be identified for sharing between circuit portions while functionality B might not have been identified for sharing.

Referring back to FIG. 2, analyzer 200 may be adapted to analyze the received behavioral description and identify portions of the behavioral description that represent common circuitry, components, functionalities, or other commonalities across described circuit portions for extraction and sharing. For example, analyzer 200 may identify portions of behavioral description 110 associated with representation 130G/functionality G of FIG. 1. However, not every component or functionality that is to be in multiple circuit portions of a synthesized circuit may be identified. For example, each of behavioral description 120A-120C includes a representation of functionality A. However, in this example, the representations of functionality A are not identified for extraction and sharing by analyzer 200. Analyzer 200 may be adapted to identify commonalities based on a directive, such as directive 140.

In one non-limiting example, analyzer 200 may flag, mark, or otherwise make the commonalities identifiable to other elements of synthesis engine 150, or may extract and/or replace the representations of identified commonalities with wrappers, references to, pointers to, prototypes of the identified commonalities, and/or the like (e.g., as a representation of an interface to a to-be-generated shared circuit portion). In one example, the commonalities are not described as commonalities in the behavioral language description of the circuit and/or in the behavioral description of the circuit portions.

In addition, analyzer 200 may be further adapted to identify a hierarchical structure, e.g., for the to-be-synthesized circuit/structural description 160. For example, this identification of hierarchical structure may include identification of a number of hierarchical levels, hierarchical levels for representations of accessing circuit portions, hierarchical levels for representations of shared circuit portions, and/or the like. The identified hierarchical structure may also be used by circuit synthesizer 230 and/or circuit portion synthesizer 210 as discussed below.

Analyzer 200 may also be adapted to provide the analyzed behavioral and/or the identifications of commonalities, to circuit portion synthesizer 210 for synthesis. However, if portions of the analyzed behavioral description represent or refer to resources such as pre-synthesized components, hardware components, and/or the like, analyzer 200 might not provide such portions to circuit portion synthesizer 210 and/or circuit synthesizer 220. Alternately, representations of, or references to, such resources may be provided to circuit portion synthesizer 210 and/or circuit synthesizer 220 but circuit portion synthesizer 210 and/or circuit synthesizer 220 may be adapted to perform little or no processing on such portions.

FIG. 3B illustrates one possible output of analyzer 200. As shown in FIG. 3B, intermediate description 315 illustrates an intermediate description in which representations of to-be-shared commonalities have been extracted and replaced with references to to-be-synthesized circuit portions (e.g., reference representations 335D). As shown, intermediate description 315 includes first CDFG 325A, second CDFG 325B, and third CDFG 325C.

Returning to FIG. 2, circuit portion synthesizer 210 may be adapted to receive behavioral descriptions of circuit portions (e.g., shared circuit portions, accessing circuit portions, and other circuit portions) and to synthesize them into structural description of circuit portions. As a more specific example, circuit portion synthesizer 210 may be adapted to synthesize behavioral descriptions 320A-320C into respective structural descriptions This synthesis may include synthesis of multiple circuit portions via sequential synthesis, concurrent synthesis, or any combination of sequential and concurrent synthesis. Synthesis order may also be determined by a manual, deterministic, or random process. However, in one example, descriptions of shared circuit portions are synthesized before descriptions of the associated accessing circuit portions, e.g., so that timing information associated with shared circuit portions is available for synthesis of the accessing circuit portions. As illustrated in FIG. 2, circuit portion synthesizer 210 includes translator 212, scheduler 214, allocator 216, description generator 218, and metadata manager 220.

Translator 212 may be adapted to translate the behavioral description circuit portion or component thereof into a first type of an intermediate description of the circuit portion or component. The first type of intermediate description may be a data structure, or other suitable representation of the logical content of the circuit portion, or component. In one more specific example, a control-data flow graph (CDFG) may be the first type of intermediate description. For example, a CDFG may be a graph representing registers, paths, operators, and/or controls associated with the circuit portion or component. Also, each circuit portion, component, or other element described in a behavioral description may be translated into at least one CDFG.

More specifically, translator 212 may be adapted to translate behavioral descriptions of shared circuit portions into intermediate descriptions of shared circuit portions, and to translate behavioral descriptions of accessing circuit portions into intermediate descriptions of accessing circuit portions.

Likewise, translator 212 may be further adapted to translate behavioral descriptions of other circuit portions circuit portions into other intermediate descriptions. One possible output of translator 212 is an un-timed or partially timed representation, for example, an unscheduled CDFG.

Scheduler 214 may be adapted to receive an unscheduled CDFG or other intermediate description from translator 212 and to schedule functionality represented by that received intermediate description in the time domain, relative to other functionality, based on timing information associated with the hardware to which the circuit is targeted. More specifically, specific functionality or represented components/other circuit elements may be assigned to particular clock cycles, for example, in a FSM, to bring the intermediate description into the time domain. Such scheduling may be based on timing information associated with the represented circuit portion, other portions of the circuit, and/or the target hardware.

In scheduling a CDFG or other intermediate description of an accessing circuit portion, scheduler 214 may base scheduling on timing information associated with the shared circuit portions that are to be accessed by the circuit portion being scheduled. Scheduler 214 may also base this scheduling on timing information associated with the elements that interface the shared circuit portions to the circuit portion being scheduled. This and other timing information may be received by scheduler 214 via a directive, as metadata (e.g., from storage unit 222), and/or the like. As one example, this information was previously generated by scheduler 214 and/or allocator 216 in conjunction with earlier synthesis of the shared circuit portion. One possible output of scheduler 214 is a second type of an intermediate description, for example, a scheduled CDFG.

Allocator 216 may be adapted to allocate hardware resources to an intermediate description such as a scheduled CDFG. For example, allocator 216 may be adapted to allocate resources to scheduled CDFGs of shared circuit portions as well as of accessing circuit portions. In one non-limiting example, allocator 216 is adapted to map portions of a scheduled CDFG to hardware resources, such as gates, registers, blocks, memories, and/or other elements of the hardware for which the circuit is targeted. Information regarding the particular hardware resources of the target hardware may also be received by allocator 216, and allocation may be based on such information. One possible output of allocator 216 is a third type of an intermediate description, for example, a scheduled and allocated CDFG.

Additionally, scheduler 214 and/or allocator 216 may be adapted to determine an appropriate numbers of instances of shared circuit portions that are to be included in a circuit. For example, such determinations may be based on whether the functionality associated with a particular type of shared circuit portion is to be accessed by different accessing circuit portions or other circuit elements concurrently (e.g., at partially or wholly overlapping times) or if such accesses are to be mutually exclusive in the time domain. Determinations may also be based on timing overhead and/or resource overhead (e.g., overhead associated with accessing a shared circuit portion), the resources associated with each instance of that type of shared circuit portion, timing/scheduling targets of the accessing circuit portions, and/or the like. For example, it may be determined that one instance of a first type of shared circuit portion may be accessed by many circuit elements. In contrast, it may be determined that an instance of other type of shared circuit portion (or another instance of the first type of shared circuit portion) is to be shared amongst a limited number of accessing circuit portions.

Description generator 218 may be adapted to receive scheduled and allocated CDFGs, or other representations of shared circuit portions, and to generate structural descriptions of such shared circuit portions. In generating structural descriptions of shared circuit portions, description generator 218 may also be adapted to generate structural descriptions of interfaces and/or arbitration logic that facilitate access to shared circuit portions. For example, the structural description of the interface and/or arbitration logic may be included in the structural description of the shared circuit portion.

Likewise, description generator 218 may also be adapted to receive scheduled and allocated CDFGs, or other representations of assessing circuit portions, and to generate structural descriptions of such assessing circuit portions. In generating structural descriptions of accessing circuit portions, description generator 218 may be adapted to generate structural descriptions of the accessing circuit portions without structural descriptions of extracted commonalities. In such an example, description generator 218 may generate with structural description of the accessing circuit portion with a wrapper, a reference to, a pointer to, or a prototype of the extracted commonality. Likewise, the structural description of an accessing circuit portion may include structural descriptions of interfaces and/or logic that facilitate access to a shared circuit portion.

Further, description generator 218 may be adapted to receive scheduled and allocated intermediate descriptions of circuit portions that are neither shared circuit portions nor accessing circuit portions, and to generate corresponding structural descriptions. The structural descriptions of such circuit portions may include structural descriptions of all functionalities described in the corresponding behavioral descriptions.

Metadata manager 220 may be adapted to store and provide metadata from/to the various elements of synthesis engine 150. For example, such metadata may include the above-discussed intermediate descriptions, timing information, instantiation information, and/or the like. More specifically, metadata manager 220 may facilitate storage of information and enable successive and/or iterative synthesis for multiple circuit portions. As one example, successive and/or iterative synthesis may include synthesis for shared circuit portions before accessing circuit portions and/or synthesis for circuit portions represented by lower level behavioral descriptions before those represented by higher level behavioral descriptions. However, synthesis for multiple circuit portions may be performed in any suitable order.

Circuit synthesizer 230 may be adapted to generate a structural description of the overall circuit based on the output of circuit portion synthesizer 210. In one example, circuit synthesizer 230 is adapted to receive or retrieve structural descriptions of multiple circuit portions and/or metadata from circuit portion synthesizer 210. Circuit synthesizer 230 may also be adapted to synthesize the overall circuit using any type of HLS, behavioral synthesis, data path synthesis, and/or other synthesis technologies. Certain examples of synthesis technologies are described in U.S. Pat. No. 7,305,650, which is hereby incorporated by reference.

More specifically, circuit synthesizer 230 may be adapted to instantiate shared circuit portions, accessing circuit portions, and other circuit portions as part of synthesizing the circuit. The structural description of the circuit, therefore, may include structural descriptions of the shared circuit portions, the accessing circuit portions, and other circuit portions. Circuit synthesizer 230 may also instantiate wires, bus, interfaces, arbitration logic, or other links or paths to facilitate communication between the various circuit portions.

As discussed above, scheduler 214 and/or allocator 216 may be adapted to determine appropriate numbers of instances of shared circuit portions that are to be included in a circuit. However, circuit synthesizer 230 may additionally or alternately be adapted to perform such determinations.

Circuit synthesizer 230 may be further adapted to determine a hierarchical structure for its structural description output and to generate this output according to the determined hierarchical structure. The determination of the hierarchical structure may be based on an indication in the behavioral description 110 of FIG. 1, an analysis of the behavior description by analyzer 200, a directive (e.g., directive 140 of FIG. 1), and/or the like. In one example, a shared circuit portion and other circuit portions are represented in the structural description at a common hierarchical level. In another example, a shared circuit portion is represented in the structural description at a hierarchical level different from the hierarchical level of an accessing circuit portion.

Further, circuit synthesizer 230 may also be adapted to output a structural description suitable for additional logic synthesis (e.g., place and route, simulation, verification, etc.) before implementation into the target hardware. In such an example, the output of circuit synthesizer 230 may include an RTL or gate level language description of the circuit. However, the output of circuit synthesizer 230 may, in some examples, be suitable for direct implementation into the target hardware.

With reference to FIG. 3C, structural description 317 may be an output of circuit synthesizer 230. In this example, structural description 370D may be placed by circuit synthesizer 230 on the same hierarchical level as one structural description that is linked to structural description 370D (e.g., structural description 327C), but on a different hierarchical level than another structural description linked to structural description 370D (e.g., structural description 327B).

FIG. 3C further illustrates an example of structural description 317 in which extracted and shared representations 330D and 380I of functionalities D and I, respectively, are linked to/adapted to be accessed by representations located on different hierarchical levels.

Further, structural description 317 includes structural description 327A that includes structural descriptions of functionalities A, B, and C in respective representations 330A, 330B, and 330C as well as structural description 327B, and access path 395. Structural description 317 also includes structural description 327C that includes representations 330X and 330Y that respectively represent functionalities X and Y.

As illustrated in FIG. 3C, access path 395 may link representation 330B to access path 390 through structural description 327A. Access paths 390 may also link structural descriptions 327A, 327B, and 327C to generated structural description 370D. Access paths 390 and 395 may be embodiments of access path 190 of FIG. 1.

In one non-limiting example, synthesis engine 150 may include additional, fewer, and/or other blocks. Further, synthesis engine 150 may be implemented in hardware, firmware, software, and/or combinations thereof.

Illustrative Processes

For clarity, the processes described herein are described in terms of operations performed in particular sequences by particular devices or elements of a system. However, it is noted that other processes are not limited to the stated sequences, devices, or elements. For example, certain acts may be performed in different sequences, in parallel, omitted, or may be supplemented by additional acts or features, whether or not such sequences, parallelisms, acts, or features are described herein. Likewise, any of the technology described in this disclosure may be incorporated into the described processes or other processes, whether or not that technology is specifically described in conjunction with a process. The disclosed processes may also be performed on or by other devices, elements, or systems, whether or not such devices, elements, or systems are described herein. These processes may also be embodied in a variety of ways. For example, they may be embodied on an article of manufacture, e.g., as computer-readable instructions stored in a computer-readable storage medium or be performed as a computer-implemented process. As an alternate example, these processes may be encoded as computer-executable instructions and transmitted via a communications medium.

Figure 4:
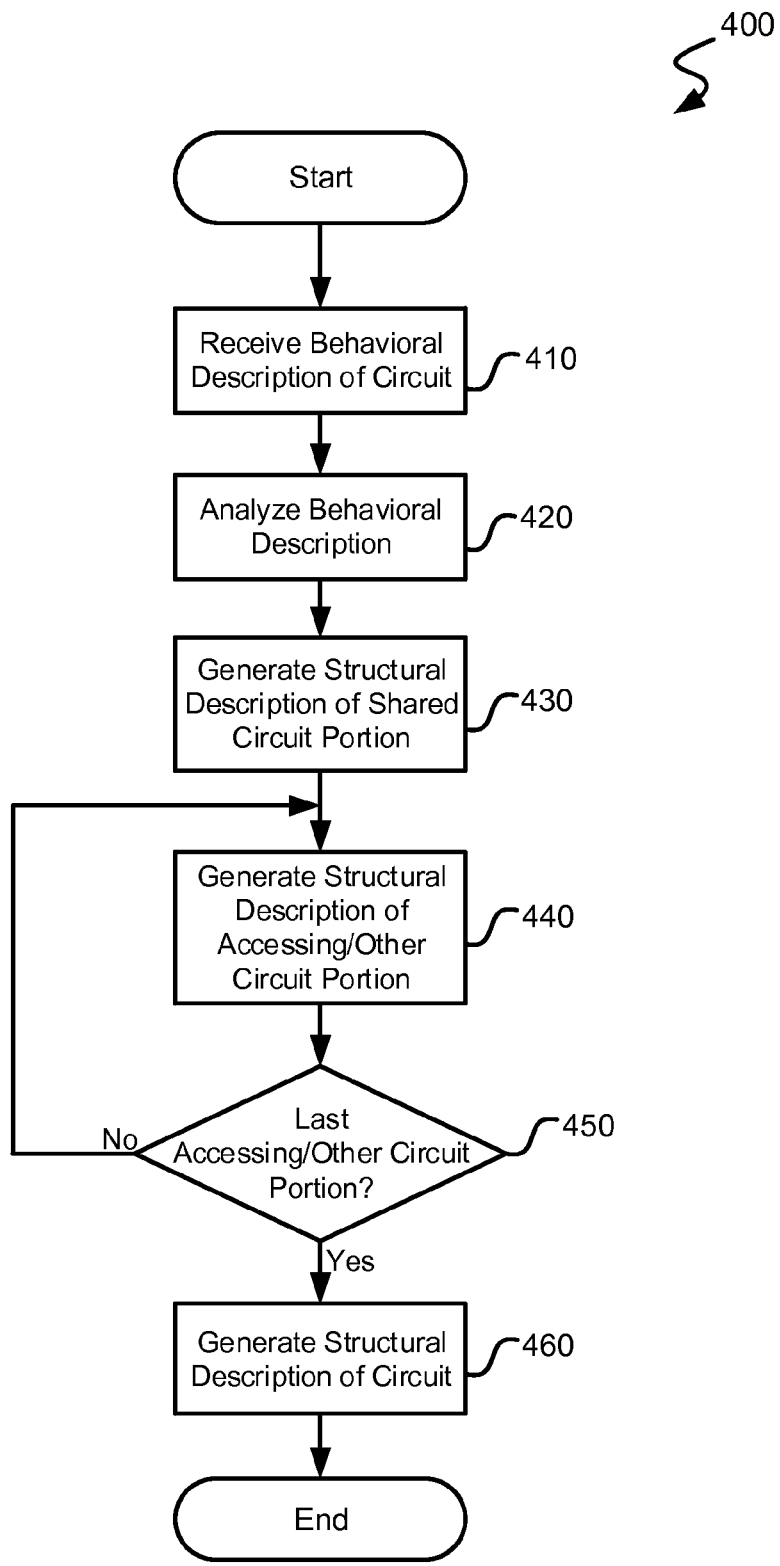
FIG. 4 is a logical flow diagram illustrating a process for synthesizing a behavioral description of a circuit into a structural representation of the circuit according to aspects of the technology.

FIG. 4 is a logical flow diagram illustrating process 400. Process 400 begins at 410 where a behavioral description of a circuit is received. The behavioral description may be embodied as one or more source files of a high level language, such as SystemC, SpecC, C++, variants thereof, and/or the like. As one example, behavioral description 110 (FIG. 1) may be received at synthesis engine 150 (FIG. 1). In addition, a directive may also be received at 410.

Process 400 continues to 420 where the received behavioral description is analyzed for commonalities, and commonalities that are to be extracted and shared are identified. This identification may be based, for example, on an automated analysis of the behavioral description or a directive. A hierarchy of the to-be-synthesized circuit/structural description may also be identified from the behavioral description at 420.

Figure 5:
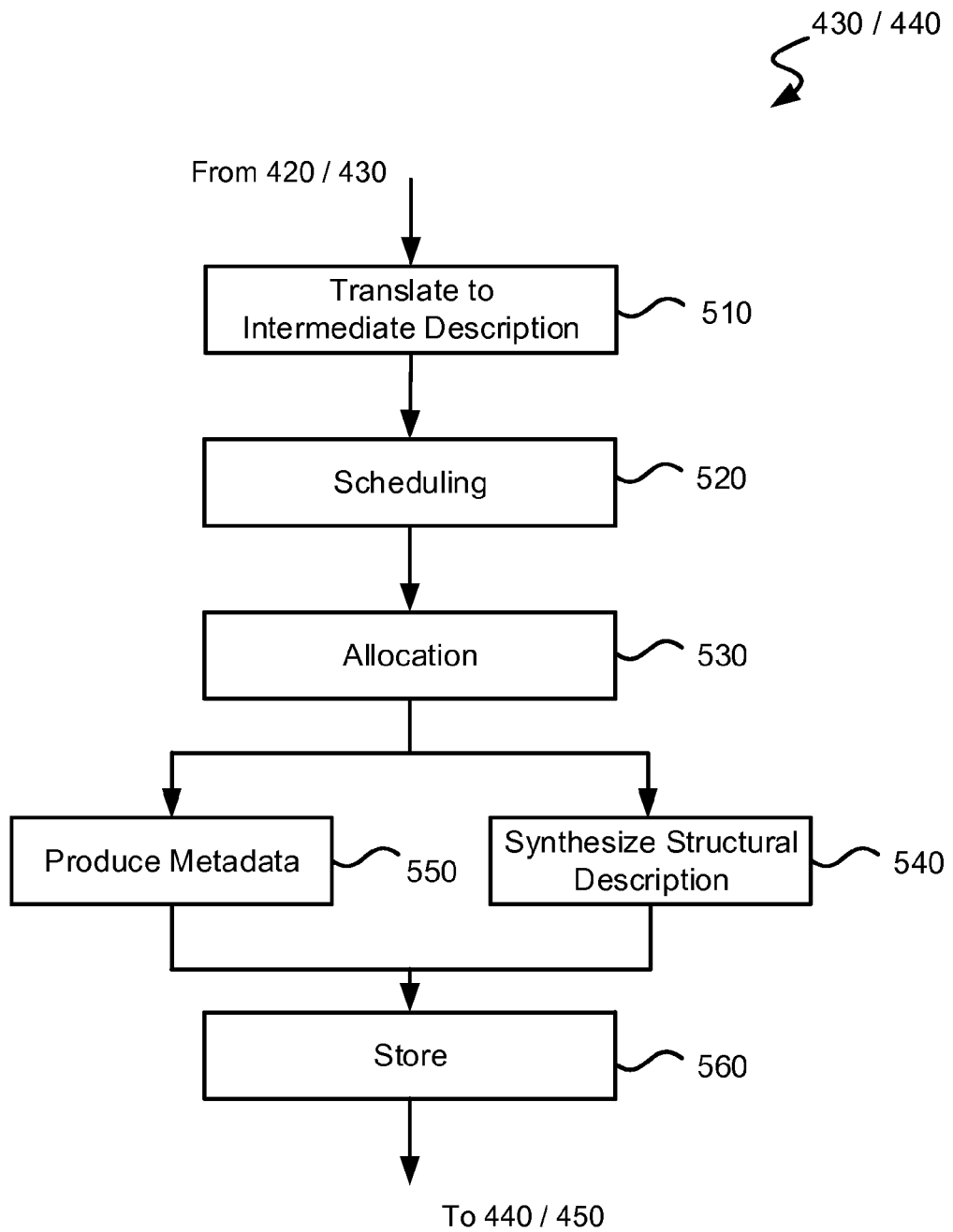
FIG. 5 is a logical flow diagram illustrating a process for generating a structural description of a circuit portion according to aspects of the technology.

Process 400 continues to 430 where a structural description of a shared circuit portion is generated, e.g., as illustrated in the logical flow diagram of FIG. 5. As illustrated in FIG. 5, process 430 starts at 510 where the behavioral description of an identified commonality is translated to an intermediate description for further processing. As previously discussed, the intermediate description may be a CDFG.

Processing then flows to 520 where the intermediate description of the shared circuit portion may be scheduled. As previously discussed, a scheduler may be employed to schedule functionality represented by the intermediate description into the time domain, relative to other functionality, based on timing information associated with a target hardware platform for the represented circuit. More specifically, specific functionality/represented circuitry may be assigned to particular clock cycles, e.g., in a FSM, to bring the intermediate description into the time domain.

From 520, processing flows to 530 where hardware resources may be allocated to the scheduled intermediate description. Particular hardware resources that are available for allocation may be made known to the process and employed for allocation. For example, indications of the blocks, gates, interconnects, and/or the like that are available on the target hardware may be considered as part of 530. Although 520 and 530 are illustrated as separate process elements, 520 and 530 may be combined.

Process 430 then continues to 540 and 550 where a structural description of the shared circuit portion is synthesized and metadata regarding the shared circuit portion is produced. Also, structural descriptions of interfaces and/or arbitration logic may also be synthesized at 540. Additionally, the metadata produced at 550 may include timing information associated with the shared circuit portion and may include timing information associated with interfaces and/or arbitration logic associated with the shared circuit portion. Although 540 and 550 are illustrated as parallel process elements, these elements may also be performed in series.

Following 540 and 550, processing flows to 560 where the structural description of the shared circuit portion and the metadata are stored in a storage unit, e.g., for use in further synthesis. Although not shown in FIG. 4, process 430 may be performed multiple times, e.g., if there are multiple shared circuit portions.

From 560, processing flows to 440 (FIG. 4) where structural descriptions of accessing and other circuit portions are synthesized. Due to similarities between 430 and 440, 440 is also discussed in conjunction with FIG. 5. Process 440 begins at 510 where a behavioral description of an accessing/other circuit portion is translated into its intermediate description for further processing. As previously discussed, a representation of a commonality may be extracted from an intermediate description of an accessing circuit portion and/or replaced by a reference to a shared circuit portion.

At 520 the intermediate description of the accessing/other circuit portion is scheduled. In scheduling the intermediate description of accessing circuit portions, timing information associated with the shared circuit portions and associated interfaces/logic may be considered. For example, results of timing analysis performed on the shared circuit portions and/or associated interfaces/logic may be employed as part of scheduling an accessing circuit portion.

Process 440 continues to 530 where hardware resources may be mapped to portions of the scheduled intermediate description of the accessing/other circuit portion. For example, this allocation may be based on the particular hardware resources of the target hardware. As with process 430, 520 and 530 for 440 may also be combined.

Similar to process 430, processing flows to 540 and 550 where a structural description of the accessing/other circuit portion is synthesized, e.g., instead of dedicated structural descriptions corresponding to such functionality, and metadata regarding the synthesized circuit portion is produced. Also, 540 and 550 may be performed in parallel or in series. Process 440 then continues to 560 where the structural description of the accessing/other circuit portion and the metadata are stored.

Returning to FIG. 4, process 400 continues to 450 where a determination is made whether there are additional accessing/other circuit portions to processed. If so, then process 400 returns to 440, otherwise, process 400 continues to 460. Also, the processing of 440 and 450 may be begin with lower level behavioral descriptions and continue to higher level behavioral descriptions. However, synthesis for multiple circuit portions may be performed in any suitable order.

At 460, a structural description of the circuit is generated or otherwise synthesized. The generated structural description of the circuit may include the structural description of the shared circuit portion, structural descriptions of the accessing circuit portions, and/or structural descriptions of other circuit portions. 460 may also include instantiating the various circuit portions, references to circuit portions, interconnects, interfaces, logic, and/or the like. Additionally, 460 may include determining an appropriate numbers of instances of shared circuit portions to be instantiated for a circuit, or such a determination may have been performed in conjunction with 520 and/or 530 of 430.

At 430, the structural description of the circuit may be written to a file in a RTL language, in a gate level language, and/or any other suitable language. Alternatively, the structural description may be a netlist of the circuit, e.g., a netlist with a single hierarchical level, or a netlist with multiple hierarchical levels.

Illustrative Descriptions

Various descriptions of several circuits are illustrated in FIGS. 6A, 6B, 6C, and 6D. The examples illustrated in FIGS. 6A, 6B, 6C, and 6D are presented as visual aids to assist in the understanding the different types of design descriptions discussed herein. However, these design descriptions do not represent the same circuit.

Figure 6B:
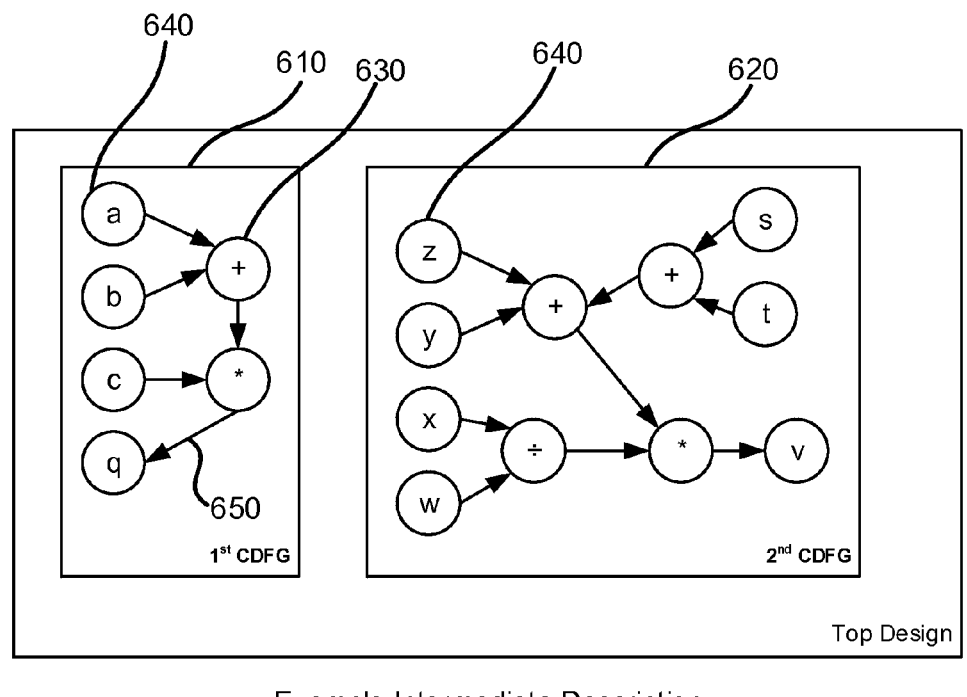
Figure 6D:
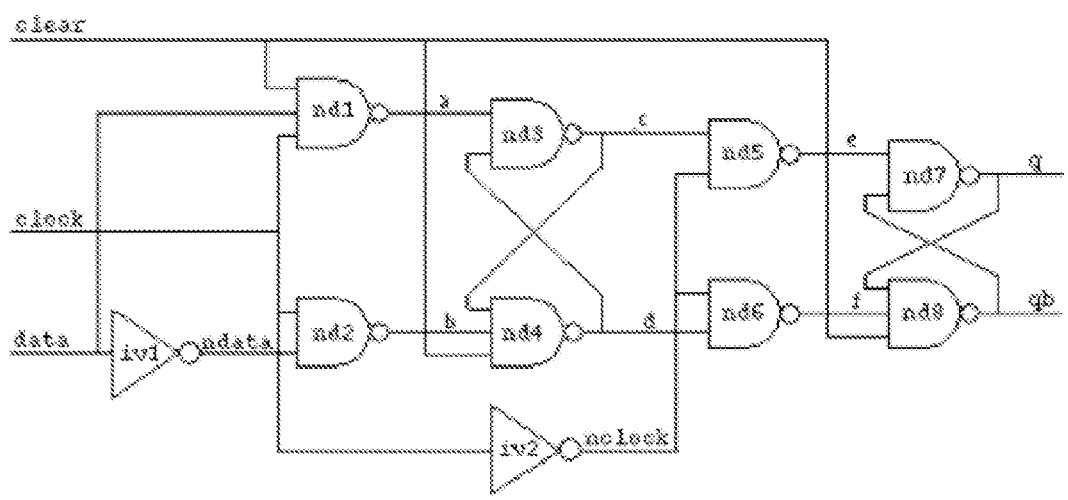

A portion of a behavioral description of a first circuit in SystemC is shown in FIG. 6A. Two intermediate descriptions, of CDFG 610 and CDFG 620, representing a second circuit are shown in FIG. 6B. In FIG. 6B, constituent elements of each CDFG may include operators 630, registers 640, paths 650, and controls (not shown). FIG. 6C illustrates a portion of a structural description of a third circuit in Verilog. FIG. 6D shows an example of gate level description of a fourth circuit.

Illustrative Computing Devices

Figure 7:
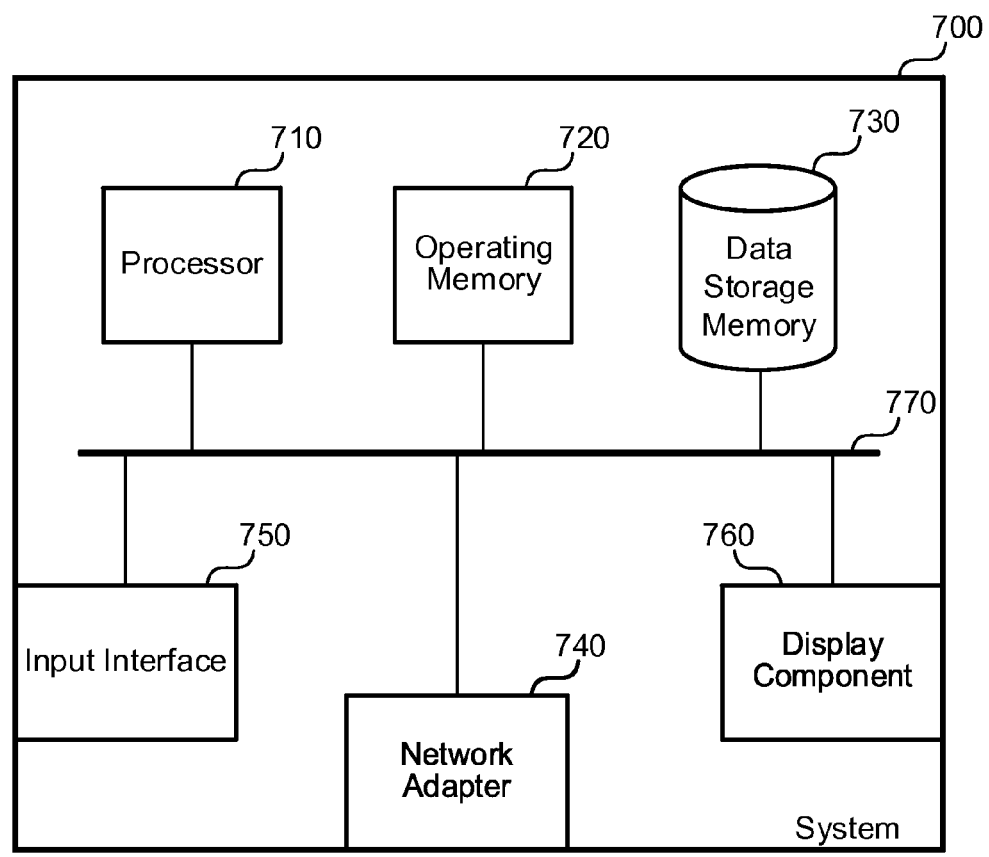
FIG. 7 is a block diagram illustrating example hardware components of a computing device according to aspects of the technology.

FIG. 7 is a high-level illustration of example hardware components of computing device 700, which may be used to practice various aspects of the disclosed technology. For example, computing device 700 may be employed to perform process 400 of FIG. 4 or processes 430/440 of FIG. 5. Computing device 700 may also be an example of synthesis engine 150 of FIGS. 1 and 3. As shown, computing device 700 includes processor 710, operating memory 720, data storage memory 730, network adapter 740, input interface 750, and display component 760. These aforementioned components may be interconnected by bus 770.

Computing device 700 may be virtually any type of general- or specific-purpose computing device. For example, computing device 700 may be a user device such as a desktop computer, a laptop computer, a tablet computer, a display device, a camera, a printer, or a smartphone. Likewise, computing device 700 may also be server device such as an application server computer, a virtual computing host computer, or a file server computer.

Computing device 700 includes at least one processor 710 adapted to execute instructions, such as instructions for implementing the above-described processes or technology. The aforementioned instructions, along with other data (e.g., datasets, metadata, operating system instructions, etc.), may be stored in operating memory 720 and/or data storage memory 730. In one example, operating memory 720 is employed for run-time data storage while data storage memory 730 is employed for long-term data storage. However, each of operating memory 720 and data storage memory 730 may be employed for either run-time or long-term data storage. Each of operating memory 720 and data storage memory 730 may also include any of a variety of data storage devices/components, such as volatile memories, semi-volatile memories, non-volatile memories, random access memories, static memories, disks, disk drives, caches, buffers, or any other media that can be used to store information. However, operating memory 720 and data storage memory 730 specifically do not include or encompass communications media, any communications medium, or any signals per se.

Also, computing device 700 may include or be coupled to any type of computer-readable media such as computer-readable storage media (e.g., operating memory 720 and data storage memory 730) and communication media (e.g., communication signals and radio waves). While the term computer-readable storage media includes operating memory 720 and data storage memory 730, this term specifically excludes and does not encompass communications media, any communications medium, or any signals per se.

Computing device 700 also includes input interface 750, which may be adapted to enable computing device 700 to receive input from users or from other devices. In addition, computing device 700 includes a display component 760, which may be adapted to render displays. In one example, display component 760 includes a frame buffer, graphics processor, graphics accelerator, or a virtual computing host computer and is adapted to render the displays for presentation on a separate visual display device (e.g., a monitor, projector, virtual computing client computer, etc.). In another example, display component 760 includes a visual display device and is adapted to render and present the displays for viewing.

Conclusion

While the above Detailed Description describes certain examples of the technology, and describes the best mode contemplated, no matter how detailed the above appears in text, the technology can be practiced in many ways. Details may vary in implementation, while still being encompassed by the technology described herein. As noted above, particular terminology used when describing certain features or aspects of the technology should not be taken to imply that the terminology is being redefined herein to be restricted to any specific characteristics, features, or aspects with which that terminology is associated. In general, the terms used in the following claims should not be construed to limit the technology to the specific examples disclosed herein, unless the Detailed Description explicitly defines such terms. Accordingly, the actual scope of the technology encompasses not only the disclosed examples, but also all equivalent ways of practicing or implementing the technology.

We claim:

1. A method for synthesizing a behavioral description of a circuit into a structural description of the circuit, the method comprising:
    using a processor to receive the behavioral description of the circuit, the behavioral description of the circuit including:
        a behavioral description of a first circuit portion, the behavioral description of the first circuit portion including a representation of:
            a first component that is to provide a first type of functionality; and
        a behavioral description of a second circuit portion, the behavioral description of the second circuit portion including representations of:
            a second component that is to provide the first type of functionality; and
            at least one other component that is to provide another type of functionality that is not provided by any component described in the behavioral description of the first circuit portion; and
    using a processor to synthesize the structural description of the circuit from the behavioral description of the circuit such that the structural description of the circuit includes:
        a structural description of a shared circuit portion, the structural description of the shared circuit portion including a structural description of circuitry that is to provide the first type of functionality;
        a structural description of the first circuit portion, the structural description of the first circuit portion including a structural representation of:
            a first interface to the shared circuit portion instead of an individual structural description of the circuitry that is to provide the first type of functionality; and
        a structural description of the second circuit portion, the structural description of the second circuit portion including a structural representation of:
            a second interface to the shared circuit portion instead of a structural description of the circuitry that is to provide the first type of functionality; and
            the at least one other component.

2. The method of claim 1, further comprising:
    extracting, from the behavioral description of the circuit, at least a first subset of functionality represented in the behavioral description of the first circuit portion; and
    extracting, from the behavioral description of the circuit, at least a second subset of functionality represented in the behavioral description of the second circuit portion, wherein the functionality of the extracted subsets is represented in the structural description by the shared circuit portion, the first interface, and the second interface.

3. The method of claim 2, wherein the first subset is selected for extraction based on an automated analysis of the behavioral description of the circuit, or based on a received directive that identifies at least the first subset.

4. The method of claim 1, wherein the structural description also includes:
    structural descriptions of connections and interface circuitry between the shared circuit portion, the first circuit portion, and the second circuit portion, wherein the connections and interface circuitry enable use of the shared circuit portion by the first circuit portion and by the second circuit portion.

5. The method of claim 1, wherein:
    the first circuit portion and the second circuit portion are represented in the behavioral description at a first hierarchical level;
    the first component and the second component are represented in the behavioral description at a second hierarchical level;
    the first hierarchical level is different than the second hierarchical level; and
    the shared circuit portion, first circuit portion, and second circuit portion are represented in the structural description at a common hierarchical level.

6. The method of claim 1, wherein synthesizing the structural description of the circuit further includes:
    scheduling subsets of functionalities of the circuit, in a time domain, relative to each other, based on timing information associated with a target hardware in which the circuit is to be implemented and on timing information associated with the shared circuit portion, the first interface, and/or the second interface; and
    allocating resources associated with the target hardware to the scheduled subsets of functionalities of the circuit.

7. A computer-readable storage medium having instructions stored therein for performing a process of synthesizing a behavioral description of a circuit into a structural representation of the circuit, the process comprising:
    receiving a behavioral language description of the circuit, the behavioral language description of the circuit including:
        behavioral language descriptions of multiple components of a first circuit portion; and
        behavioral language descriptions of multiple components of a second circuit portion, wherein at least a first component of the second circuit portion is functionally equivalent to a first component of the first circuit portion, and wherein at least one other component of the second circuit portion is not functionally equivalent to any component of the first circuit portion; and synthesizing a structural language description of the circuit from the behavioral language description of the circuit, including:
  generating a structural description of a shared circuit portion that is to provide a functionality of a type described by the behavioral language descriptions of the first component of the first circuit portion and of the first component of the second circuit portion;
  generating structural descriptions of interfaces between the shared circuit portion and each of the first circuit portion and the second circuit portion instead of individual structural descriptions of the first component of the first circuit portion and of the first component of the second circuit portion; and
  generating structural descriptions of the first circuit portion and of the second circuit portion.

8. The computer-readable storage medium of claim 7, wherein the process further comprises:
  selecting a first subset of functionality and a second subset of functionality respectively associated with the first circuit portion and with the second circuit portion based on a received directive that identifies the first subset and the second subset, or based on an automated analysis of the behavioral description of the circuit; and
  extracting at least the selected first and second subsets from the behavioral description of the circuit, wherein the functionality of the extracted subsets is represented in the structural language description of the circuit by the shared circuit portion and the interfaces to the shared circuit portion.

9. The computer-readable storage medium of claim 7, wherein:
  the first circuit portion and the second circuit portion are represented in the behavioral description at a first hierarchical level;
  the first component of the first circuit portion and the first component of the second circuit portion are represented in the behavioral description at one or more hierarchical levels other than the first hierarchical level; and
  the shared circuit portion, first circuit portion, and second circuit portion are represented in the structural description at a same hierarchical level.

10. The computer-readable storage medium of claim 7, wherein synthesizing the structural language description of the circuit further includes:
  scheduling subsets of functionality of a second component of the first circuit portion, in a time domain, relative to each other, the scheduling including:
    synthesizing an order of multiple operators and multiple registers in the time domain based on timing information associated with a target hardware in which the circuit is to be implemented; and
  allocating resources associated with the target hardware to the scheduled subsets of the functionality of the second component of the first circuit portion.

11. The computer-readable storage medium of claim 7, wherein the first component of the first circuit portion includes a finite state machine (FSM), an encoder, a decoder, a hardware accelerator, a memory, a circuit adapted to perform a mathematical function, a circuit adapted to perform a logical function, and/or a filter.

12. The computer-readable storage medium of claim 7, wherein the shared circuit portion is not described as a shared circuit portion in the behavioral language description of the first circuit portion or in the behavioral language description of the second circuit portion.

13. A computing device selected from the group consisting of a desktop computer, a laptop computer, a tablet computer, a smartphone, an application server computer, a virtual computing host computer, and a file server computer, for synthesizing a first description of a circuit into a second description of the circuit, comprising:
  a memory and a processor that are respectively configured to store and execute instructions, including instructions organized into:
  an analyzer to:
    receive the first description of the circuit, the circuit including at least a first circuit portion and a second circuit portion, the first description describing a first hierarchical structure for the first circuit portion, the second circuit portion, and components of the first circuit portion and the second circuit portion; and
    determine a first component that is described in the first description as being part of the first circuit portion and that has a commonality with a second component described in the first description as being part of the second circuit portion;
  a circuit portion synthesizer to:
    synthesize a shared circuit portion as a replacement for the determined first and second components; and
    synthesize a plurality of accessing circuit portions; and
  a circuit synthesizer to synthesize the second description of the circuit, the second description describing:
    a second hierarchical structure for the first circuit portion, the second circuit portion, and the components thereof, the second hierarchical structure being different than the first hierarchical structure;
    the shared circuit portion;
    the first circuit portion with an interface to the shared circuit portion instead of an individual description of the first component; and
    the second circuit portion with an interface to the shared circuit portion instead of an individual description of the second component;
  whereby the computing device synthesizes the first description of the circuit into the second description of the circuit.

14. The computing device of claim 13, wherein the first description of the circuit is a behavioral description of the circuit and the second description of the circuit is a structural description of the circuit.

15. The computing device of claim 13, wherein:
  the first description of the circuit describes the circuit at a first level of design abstraction; and
  the second description of the circuit describes the circuit at a second level of design abstraction that is lower than the first level of design abstraction.

16. The computing device of claim 13, wherein the circuit portion synthesizer is further to schedule an order of multiple operators and multiple registers of a path through the circuit in a time domain and to assign physical resources of a target hardware platform for the circuit to each of the multiple operators and multiple registers.

17. The computing device of claim 13, wherein the circuit portion synthesizer is further to sequentially synthesize a first description of the first circuit portion to a second description of the first circuit portion and synthesize a first description of the second circuit portion to a second description of the second circuit portion.

18. The computing device of claim 13, wherein the analyzer is further to determine the first component based on a directive, or based on an automated analysis of the first description of the circuit.

19. The computing device of claim 13, wherein:
the shared circuit portion, first circuit portion, and second circuit portion are represented in the second hierarchical structure at a same hierarchical level.

20. The computing device of claim 13, wherein the shared circuit portion is not described in the first description of the first circuit portion or in the first description of the second circuit portion as being a shared circuit portion.

* * * * *